(12) United States Patent
Sun

(10) Patent No.: US 9,224,804 B2
(45) Date of Patent: Dec. 29, 2015

(54) GUARDING RING STRUCTURE OF A HIGH VOLTAGE DEVICE AND MANUFACTURING METHOD THEREOF

(71) Applicant: SHANGHAI IC R&D CENTER CO., LTD., Shanghai (CN)

(72) Inventor: Deming Sun, Shanghai (CN)

(73) Assignee: Shanghai IC R&D Center Co., Ltd., Shanghai (CN)

( * ) Notice: Subject to any disclaimer, the term of this patent is extended or adjusted under 35 U.S.C. 154(b) by 0 days.

(21) Appl. No.: 14/369,190

(22) PCT Filed: Nov. 21, 2012

(86) PCT No.: PCT/CN2012/084945
§ 371 (c)(1),
(2) Date: Jun. 26, 2014

(87) PCT Pub. No.: WO2014/063397
PCT Pub. Date: May 1, 2014

(65) Prior Publication Data
US 2014/0353793 A1    Dec. 4, 2014

(30) Foreign Application Priority Data

Oct. 22, 2012    (CN) .......................... 2012 1 0404971

(51) Int. Cl.
| | |
|---|---|
| *H01L 21/322* | (2006.01) |
| *H01L 29/06* | (2006.01) |
| *H01L 29/40* | (2006.01) |
| *H01L 29/78* | (2006.01) |
| *H01L 21/283* | (2006.01) |
| *H01L 29/08* | (2006.01) |

(52) U.S. Cl.
CPC .......... *H01L 29/0619* (2013.01); *H01L 21/283* (2013.01); *H01L 21/322* (2013.01); *H01L 29/0607* (2013.01); *H01L 29/402* (2013.01); *H01L 29/404* (2013.01); *H01L 29/7811* (2013.01); *H01L 29/0878* (2013.01)

(58) Field of Classification Search
CPC ..................................... H01L 29/0619
USPC ......................................... 257/490
See application file for complete search history.

(56) References Cited

U.S. PATENT DOCUMENTS

2006/0043480 A1* 3/2006 Tsuchitani et al. ........... 257/341
2009/0302376 A1* 12/2009 Inoue et al. ................... 257/329

FOREIGN PATENT DOCUMENTS

CN          1978181 A      6/2007

* cited by examiner

*Primary Examiner* — Edward Wojciechowicz

(57) ABSTRACT

The present invention provides a guarding ring structure of a semiconductor high voltage device and the manufacturing method thereof. The guarding ring structure comprises a first N type monocrystalline silicon substrate (3), a second N type monocrystalline silicon substrate (8), a discontinuous oxide layer (2), a metal field plate (1), a device region (9), multiple P+ type diffusion rings (5) and an equipotential ring (4). The second N type monocrystalline silicon substrate (8) is a single N type crystalline layer epitaxially formed on the first N type monocrystalline silicon substrate (3) and has lower doping concentration than the first N type monocrystalline silicon substrate (3). N type diffusion rings (6) are embedded in the inner side of the P+ type diffusion rings (5) and are fully depleted at zero bias voltage. The guarding ring structure can achieve the same withstand voltage with less area and design time.

7 Claims, 3 Drawing Sheets

Unit inside the dashed frame can be repeated

Unit inside the dashed frame
can be repeated

--Prior Art--

--Prior Art--

Unit inside the dashed frame can be repeated

US 9,224,804 B2

GUARDING RING STRUCTURE OF A HIGH VOLTAGE DEVICE AND MANUFACTURING METHOD THEREOF

CROSS-REFERENCE TO RELATED APPLICATION

This application claims the priority benefit of International Patent Application Ser. No. PCT/CN2012/084,945, filed Nov. 21, 2012, which is related to and claims the priority benefit of China patent application serial no. 201210404971.3 filed Oct. 22, 2012. The entirety of each of the above-mentioned patent applications is hereby incorporated by reference herein and made a part of this specification.

FIELD OF THE INVENTION

The present invention relates to the field of semiconductor technology and particularly to a guarding ring structure of a high voltage semiconductor power device and the manufacturing method thereof.

BACKGROUND OF THE INVENTION

With the decrease of the oil and coal stocks and increase of the human energy consumption, energy saving has become a consensus in the 21st century. According to the estimation by the U.S. department of energy (DOE), about two-thirds of the electricity is used for motor drivers. Since semiconductor power devices such as IGBTs (insulated gate bipolar transistors) and the matching RFDs (fast recovery diodes), which are mainly used as high frequency rectifier diodes, free-wheeling diodes or damping diodes in switching power supplies, PWM width modulators, frequency converters and other electronic circuits, can save the energy consumption of the motor driver by 20%-30%, it can be expected that the application of the power devices will get a rapid growth in the future.

PN junctions are elementary "building blocks" for the structure of a power device. The PN junction refers to a space charge region formed at the interface between the P-type and N-type semiconductor materials inside a same semiconductor substrate (usually a silicon substrate or a germanium substrate) by doping and diffusion of dopants.

However, since the junction depth of the diffused PN junctions is usually a few microns, the small radius of the junction curvature may cause electric field intensity, thereby making the breakdown voltage far below the planar junction breakdown voltage. For example, for a device having a P-N junction of 5 microns deep, the planar junction breakdown voltage thereof is assumed to exceed 1200V however, the actual breakdown voltage may be lower than 400V due to the electric field intensity caused by the junction curvature, which is far below the planar junction breakdown voltage. Therefore, guarding rings are needed in the periphery regions of the device. The structure of a field plate combined with field limiting rings is an earlier developed guarding ring and is widely applied so far due to its simple manufacturing process without additional photoetching steps.

FIG. 1 illustrates a sectional diagram of a conventional field plate and field limiting ring structure. The middle region in FIG. 1 refers to the device region 9, the guarding ring is composed of diffusion rings 5 which are P+ type diffusions formed in an N type monocrystalline silicon body 3, and an outmost equipotential ring 4 which is an N+ type diffusion region and is coupled to a high voltage or floated when the device region 9 works. The guarding ring is a symmetric structure around the device region 9 according to its cross-section. The regions between the two P+ type diffusion rings outside the device region 9 refers to the main withstand voltage region. The P type diffusion ring 5 adjacent to the device region 9 refers to an innermost ring, which is grounded when the device region 9 works. The P+ type diffusion ring 5 surrounding the innermost ring refers to a first ring which is floated when the device region 9 works. The number of the P+ type diffusion rings 5 (the field limiting rings) as shown in FIG. 1 can be added and thus a second ring, a third ring, a fourth ring and even more rings can be formed to satisfy the withstand voltage requirements. The manufacturing process of the guarding ring comprises: performing photoetching to form the pattern of the P+ type diffusion ring regions and implanting to form the diffusion rings 5; then performing photoetching to form the pattern of an equipotential ring region and implanting to form the equipotential ring 4; and performing well drive-in.

FIG. 2 illustrates a detailed sectional diagram of the conventional field limiting ring structure. Wherein, the fine dash line refers to the boundary of the depletion region, the dot and dash line refers to the electric field line. The conventional field limiting ring structure illustrated in FIG. 2 forms a triangle electric field distribution.

FIG. 5 is a comparison diagram illustrating the electric field distribution formed underlying the field oxide layer in the conventional field limiting ring and that foamed in the structure of the present invention. The triangle profile represents the electric field distribution in one ring spacing of the field limiting ring structure. As shown in FIG. 5, the electric field distribution of the conventional field limiting ring structure forms a triangle profile, wherein the left side of the triangle with higher slope represents the electric field at the P type depletion region inside the P+ type diffusion ring 5 region and the right side of the triangle with lower slope represents the electric field at the N type depletion region between the two diffusion ring 5 regions.

The magnitude of the electric field slope relates to the doping concentration. The higher the doping concentration is, the greater the slope will be. Since the P+ type doping concentration in the diffusion ring 5 is always higher than the N type doping concentration in the region between the diffusion rings 5, the slope of the left side of the triangle is higher than that of the right side, the peak of the triangle represents the breakdown electric field and the area of the triangle represents the withstand voltage.

Those skilled in the art know that with the increase of the withstand voltage, more P+ type diffusion rings 5 are needed (For example, a field limiting ring structure generally utilizes 4 rings to achieve 1200V withstand voltage, while utilizes 22 rings to achieve 3300V withstand voltage). Therefore, it requires more guarding ring area and costs more time to design the guarding ring.

Accordingly, in the conventional fielding limiting ring structure, the ring space is not fully utilized as the electric field distributes in a triangular profile. How to make full use of the ring spacing so as to achieve the same withstand voltage with reduced ring spacing, or to enable each ring spacing to achieve a higher withstand voltage and thus reduce the ring number is an urgent problem to be solved in the industry.

SUMMARY OF THE INVENTION

Accordingly, at least one object of this invention is to provide a high voltage guarding ring structure of a semiconductor power device different from the conventional ring structure to reduce the guarding ring area by shortening the ring space while keeping the withstand voltage of each ring space maintained or to reduce the guarding ring area as well as the guarding ring design time by decreasing the guarding ring numbers through optimizing each ring spacing and improving the withstand voltage of each ring spacing.

To achieve the above purpose, the present invention provides a guarding ring structure of a semiconductor high voltage device comprising: a first N type monocrystalline silicon substrate, a second N type monocrystalline silicon substrate, a discontinuous oxide layer, a metal field plate, a device region, multiple P+ type diffusion rings and an equipotential ring; wherein, the second N type monocrystalline silicon substrate is an N type single crystalline layer formed on the first N type monocrystalline silicon substrate; the doping concentration of the second N type monocrystalline silicon substrate is lower than that of the first N type monocrystalline silicon substrate; the discontinuous oxide layer is disposed on the second N type monocrystalline silicon substrate; the metal field plate partially covers the exposed surface of the second N type monocrystalline silicon substrate and the discontinuous oxide layer; the device region is embedded in the second N monocrystalline silicon substrate; the multiple P+ type diffusion rings are embedded in the second N type monocrystalline silicon substrate, wherein the P+ type diffusion ring adjacent to the device region is an innermost ring which surrounds and centers the device region and is grounded when the device region works; the other P+ type diffusion rings are concentric with the innermost ring and are floated when the device region works; the equipotential ring is embedded in the second N type monocrystalline silicon substrate and surrounds the periphery of the multiple P+ type diffusion rings.

Preferably, the depth of the second N type monocrystalline silicon substrate is greater than the junction depth of the P+ type diffusion ring and less than 10 microns.

Preferably, the guarding ring further comprises N type diffusion rings fully depleted at zero bias voltage, the N type diffusion rings are embedded in the P+ type diffusion rings.

Preferably, the N type diffusion ring is close to the inner boundary of the P+ diffusion ring embedding the same.

Preferably, the N type injection diffusion ring is formed between the inner boundary of the P+ type diffusion ring and the boundary of the depletion region of the P+ type diffusion ring.

Preferably, the bottom boundary of the N type diffusion rings is as deep as or shallower than that of the depletion region of the P+ type diffusion rings.

Preferably, the doping concentration of the N type diffusion rings is higher than that of the second N type monocrystalline silicon substrate and is equal to or less than 1e15/cm$^3$.

Preferably, the thickness of the discontinuous oxide layers is 50 nm.

To achieve the above purpose, the present invention also provides a manufacturing method of the guarding ring structure of the semiconductor high voltage device, the method comprises the following steps:

Step S01: epitaxially forming the lightly doped second N monocrystalline silicon substrate on the first N monocrystalline silicon substrate of FZ-Si; wherein the doping concentration of the second N monocrystalline silicon substrate is lower than that of the first N monocrystalline silicon substrate;

Step S02: forming a thin oxide layer on the surface of the second N type monocrystalline silicon substrate, performing photoetching to form an equipotential ring region, implanting N type impurities and performing well drive-in after removing the photoresist;

Step S03: forming a field oxide layer on the second N type monocrystalline silicon substrate and the thin oxide layer; performing photoetching to form P+ type diffusion ring regions, etching the field oxide layer, implanting P+ type impurities into the diffusion ring regions to form the P+ type diffusion rings, then performing well drive-in; performing photoetching to form the device region, etching the field oxide layer.

Step S04: depositing a metal layer and etching, depositing a passivation layer and etching, performing a thinning process to the backside of the first N type monocrystalline silicon substrate followed by an impurity implantation and activation process, then depositing a metal layer on the backside of the first N type monocrystalline silicon substrate.

Preferably, the Step S02 further comprise: performing photoetching to form N type diffusion ring regions and implanting N type impurities therein to form the N type diffusion rings.

As mentioned above, in the present invention, the high voltage guarding ring structure of the semiconductor power device introduces an N type epitaxial layer and N type diffusion rings embedded in the P type diffusion rings, thereby changing the triangle electric field distribution of the conventional high voltage guarding ring into a trapezoid electric field distribution. Accordingly, the guarding ring structure can achieve the required withstand voltage with less area and design time by either reducing the ring spacing or reducing the ring number.

DETAILED DESCRIPTION OF THE EMBODIMENTS

Reference will now be made in detail to the present preferred embodiments to provide a further understanding of the invention. The specific embodiments and the accompanying drawings discussed are merely illustrative of specific ways to make and use the invention, and do not limit the scope of the invention or the appended claims.

The guarding ring structure comprising a field plate and field limiting rings of the present invention will be described in further details hereinafter with respect to the embodiments and the accompany drawings FIG. 3 to FIG. 5.

Figure 1:
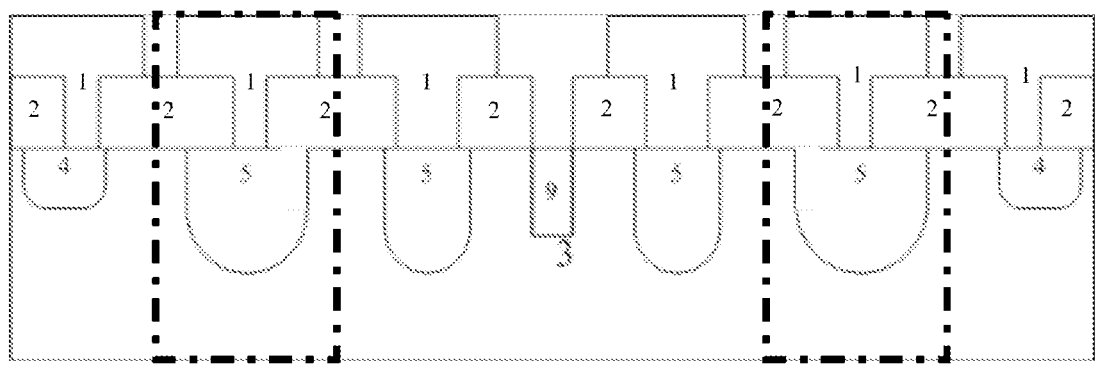
FIG. 1 is a sectional diagram of the field limiting ring structure in the prior art.
Figure 2:
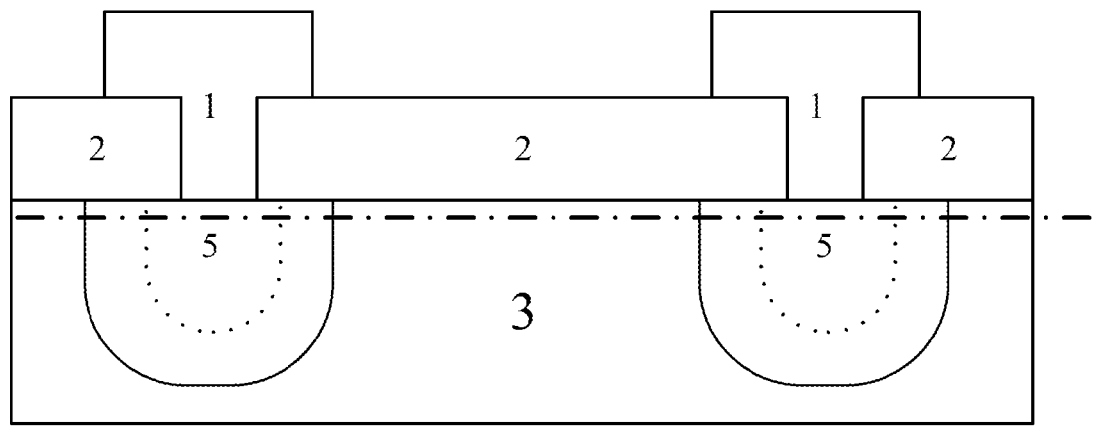
FIG. 2 is a detailed sectional diagram of the field limiting ring structure in the prior art in which the fine dash line represents the boundary of the depletion region and the dot and dash line represents the electric field line.
Figure 3:
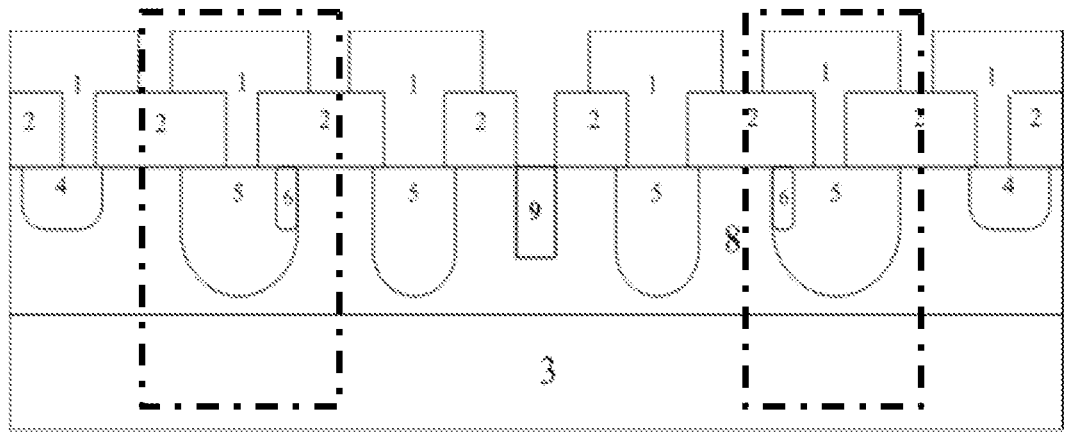
FIG. 3 is a sectional diagram of the field limiting ring structure in an embodiment of the present invention.

FIG. 3 is a sectional diagram of the guarding ring structure having a field plate and field limiting rings in an embodiment.

Referring to FIG. 3, the guarding ring formed outside the device region 9 only comprises two P+ type diffusion rings 5 and one equipotential ring 4 for simplicity. However, in other embodiments, the number of the P+ type diffusion rings 5 can be 3, 4, 5 or more according to the withstand voltage requirement, and a detailed description is omitted herein.

The guarding ring structure of the present invention differs from the conventional structure by adding a lightly doped N type epitaxial layer (namely the second N type monocrystalline silicon substrate 8) on the first N type monocrystalline silicon substrate 3, and embedding N type diffusion rings 6 which are fully depleted at zero bias voltage in the P+ type diffusion ring 5.

It is well known that limited increase of the breakdown electric field can be realized by raising the doping concentration in the first N type monocrystalline silicon substrate 3 by orders of magnitude, however, the resulting smaller depletion region width may lead to a breakdown first occurred in the device region. Referring to FIG. 5, in order to decrease the slope of the triangle electric field distribution, the first N type monocrystalline silicon substrate 3 is required to be lightly doped. On the other hand, since the doping concentration of the N type monocrystalline silicon (the first N type monocrystalline silicon substrate 3) determines the electrical characteristic of the drifting region, it cannot be selected arbitrarily. Therefore, the second N type monocrystalline silicon substrate 8 having lower doping concentration than the first N type monocrystalline silicon substrate 3 is epitaxially formed on the first N type monocrystalline silicon substrate 3 in the present invention.

As shown in FIG. 3, in one embodiment of the present invention, the guarding ring structure comprises a first N type monocrystalline silicon substrate 3, a second N type monocrystalline silicon substrate 8, a device region 9 embedded in the second N type monocrystalline silicon substrate 8, a discontinuous oxide layer 2 formed on the surface of the second N monocrystalline silicon substrate 8, and a metal field plate 1 partially covering the exposed second N type monocrystalline silicon substrate 8 and the oxide layer 2. Preferably, the thickness of the oxide layer 2 is 50 nm.

The guarding ring structure for each device region 9 comprises two P+ type diffusion rings 5 embedded in the N type monocrystalline silicon substrate 8 and one equipotential ring 4 all surrounding around the device region 9. Wherein, the second N type monocrystalline silicon substrate 8 is a single N type crystalline layer epitaxially formed on the first N monocrystalline silicon substrate 3, the doping concentration of the second N monocrystalline silicon substrate 8 is lower than that of the first N monocrystalline silicon substrate 3.

The P+ type diffusion ring 5 adjacent to the device region 9 is an innermost ring which is grounded when the device region 9 works; the other P+ type diffusion ring 5 surrounds the outside of the innermost ring and is floated when the device region 9 works; the N+ type equipotential ring 4 surrounds the outside of the P+ type diffusion rings 5 and is coupled to a high voltage or is floated when the device region 9 works.

Furthermore, the depth of the second N type monocrystalline silicon substrate 8 is greater than the junction depth of the P+ type diffusion rings 5 and less than 10 μm.

Figure 4:
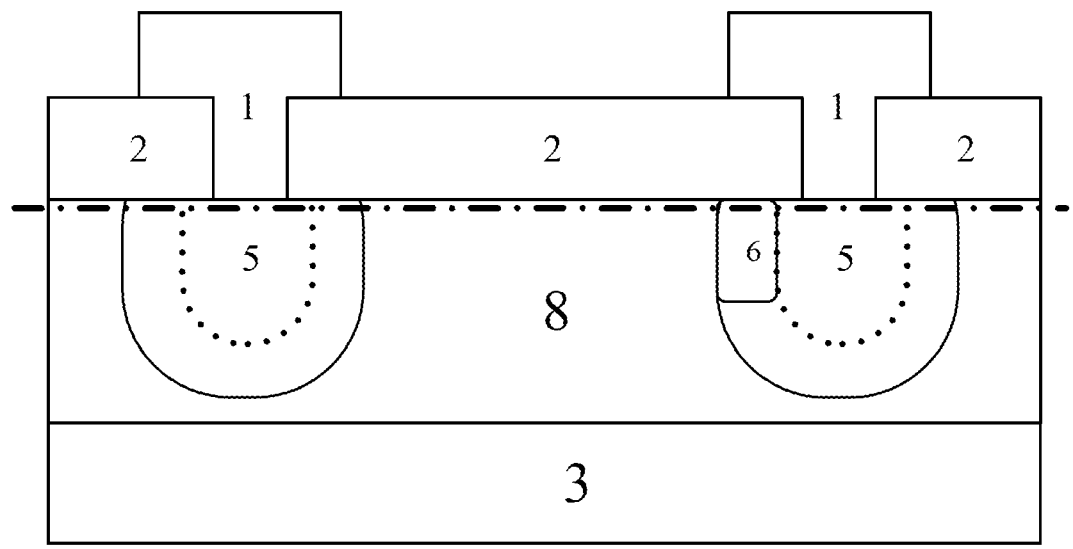
FIG. 4 is a detailed diagram of the field limiting ring structure of the present invention shown in FIG. 3 in which the fine dash line represents the boundary of the depletion region and the dot and dash line represents the electric field line.

FIG. 4 is a detailed drawing of the guarding ring structure of the present invention as shown in FIG. 3 in which the fine dash line represents the boundary of the depletion region and the dot and dash line represents the electric field line. As shown in FIG. 4, N type diffusion rings 6 which become fully depleted at zero bias voltage are embedded in the P+ type diffusion rings 5. The N type diffusion ring 6 provides positive charges to increase the electric field rapidly, thereby forming a trapezoid electric field. Preferably, each of the P+ type diffusion rings 5 includes one N type diffusion ring 6, and the N type diffusion ring 6 is fully depleted so as to provide positive charges.

Moreover, the N type diffusion ring 6 can be close to the inner boundary of the P+ type diffusion ring 5 embedding it. Preferably, the N type diffusion ring 6 can be formed between the inner boundary of the P+ type diffusion ring and the boundary of the depletion region of the P+ type diffusion ring 5.

It is known that with more charges being introduced into the N doped regions within the P+ type diffusion rings, the additive electric field caused by the N type diffusion ring becomes stronger. Therefore, the area of the N type diffusion ring 6 is preferred to be larger. In the practical design, the bottom of the N type diffusion rings 6 is generally designed to be in the same level with the bottom boundary of depletion region in the P+ type diffusion rings 5.

In addition, since the N type diffusion rings are required to be fully depleted, the doping concentration therein cannot be too high. Accordingly, the doping concentration of the N type diffusion rings 6 is preferred to be higher than that of the first N type monocrystalline silicon substrate 3 which is $6.5e13/cm^3$ to achieve a withstand voltage of 1200V, but less than or equal to $1e15/cm^3$. The doping concentration of the N type diffusion rings 6 can be higher than the second monocrystalline silicon substrate 8 by two orders of magnitude. Furthermore, one side of the boundary of the N type diffusion ring 6 at the inside of the P+ type diffusion ring 5 is preferred to overlap the inner side of the P+ diffusion ring 5 partly.

Figure 5:
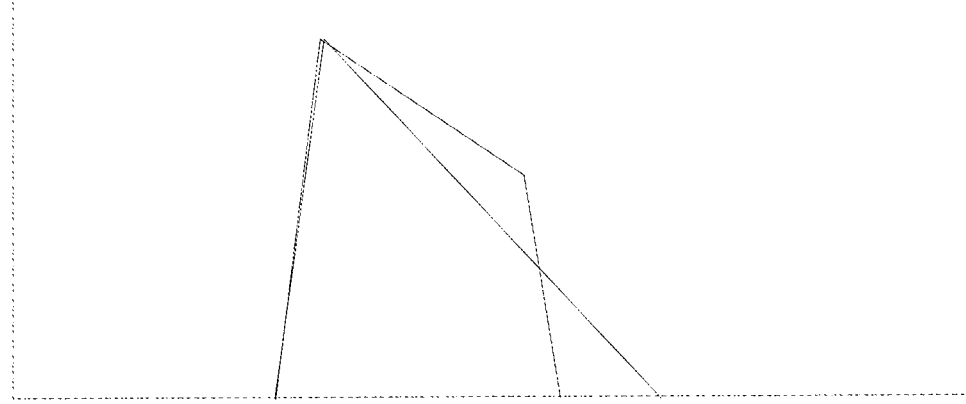
FIG. 5 is a comparison diagram of the electric field distribution formed underlying the oxide layer in the conventional field limiting ring and that formed in the field limiting ring of the present invention; wherein, the electric field distribution formed in the conventional field limiting ring structure has a triangle profile while the electric field distribution formed in the field limiting ring structure of the present invention has a trapezoid profile.

Referring to FIG. 5, which is a comparison diagram illustrating the electric field distribution formed underlying the oxide layer in the conventional field limiting ring structure and that in the structure of the present invention. The trapezoid profile represents the electric field distribution in a single ring spacing of the field limiting ring structure of the present invention.

As shown in FIG. 5, according to the guarding ring structure of the present invention, the electric field distribution is changed from a triangle profile into a trapezoid profile. As can be seen, the area of the trapezoid representing the withstand voltage is bigger than the area of the triangle and the trapezoid electric field can utilize the area more effectively compared with the triangle electric field. In practical applications, the trapezoid electric field can be utilized as required in the following two ways: the first way is to reduce the ring spacing between the two P+ type diffusion rings 5 while maintaining the same withstand voltage of each ring spacing. The second way is to optimize the ring spacing to maximize the efficiency of the trapezoid electric field, that is to maximize the withstand voltage of each ring spacing. Since the withstand voltage of each ring spacing increases, the number of the rings can be reduced to achieve the same withstand voltage, the area of the ring regions can also be reduced. For example, a commercial guarding ring requires 22 rings to achieve the withstand voltage of 3300V, which costs plenty of time in the device simulation phase to optimize the rings one by one. Since each additional ring requires more time, the design time of guarding ring can be shortened greatly by reducing the number of the rings.

In one embodiment of the present invention, the manufacturing method of the guarding ring structure of a semiconductor high voltage device comprises the following steps:

Step S01: epitaxially forming a lightly doped second N type monocrystalline silicon substrate on a first N type monocrystalline silicon substrate of FZ-Si; wherein the doping concentration of the second N type monocrystalline silicon substrate is lower than that of the first N type monocrystalline silicon substrate;

Step S02: forming a thin oxide layer on the surface of the second N type monocrystalline silicon substrate, performing photolithography to form an equipotential ring region, implanting N type impurities, and performing well drive-in after removing the photoresist;

Step S03: forming a field oxide layer on the second N type monocrystalline silicon substrate and the thin oxide layer; performing photoetching to form P+ type diffusion ring regions, etching the field oxide layer, implanting P+ type impurities in the diffusion ring regions to form P+ type diffusion rings, then performing well drive-in; performing photoetching to form a device region, etching the field oxide layer.

Step S04: depositing a metal layer and etching, depositing a passivation layer and etching, performing a thinning process to the backside of the first N type monocrystalline silicon substrate followed by an impurity implantation and activation process, then depositing a metal layer on the backside of the first N type monocrystalline silicon substrate.

In some preferred embodiments of the present invention, the Step S02 further comprises performing photoetching to form N type diffusion ring regions and implanting N type impurities therein to form N type diffusion rings. In this way, the P+ type diffusion ring formed in the Step S03 should contain the N type diffusion ring. Preferably, the N type diffusion ring 6 lies close to the inner boundary of the P+ type diffusion ring 5, that is, the N type diffusion 6 is embedded between the inner boundary of the P+ diffusion ring 5 and the boundary of the depletion region of the P+ type diffusion ring 5.

In conclusion, the guarding ring structure of the present invention introduces the lightly doped epitaxial second N type monocrystalline silicon substrate and the N type diffusion rings embedded in the inner side of the P+ type diffusion rings so as to change the conventional triangle electric field distribution into the trapezoid electric field distribution. According to the guarding ring structure of the present invention, same withstand voltage can be achieved with rings having reduced ring spacing, thereby decreasing the area of the guarding ring; or else, each ring spacing in the guarding ring structure can be optimized to increase the withstand voltage thereof to reduce the number of the rings, thereby decreasing the area as well as the design time of the guarding ring.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A guarding ring structure of a semiconductor high voltage device comprising:
   a first N type monocrystalline silicon substrate (3);
   a second N type monocrystalline silicon substrate (8) which is an N type single crystalline layer formed on the first N monocrystalline silicon substrate (3); the doping concentration of the second N monocrystalline silicon substrate (8) is lower than that of the first N monocrystalline silicon substrate (3);
   a discontinuous oxide layer (2) disposed on the surface of the second N type monocrystalline silicon substrate (8);
   a metal field plate (1) partially covering the exposed surface of the second N type monocrystalline silicon substrate (8) and the oxide layer (2);
   a device region (9) embedded in the second N monocrystalline silicon substrate (8);
   multiple P+ type diffusion rings (5) embedded in the second N type monocrystalline silicon, wherein the P+ type diffusion ring (5) adjacent to the device region (9) is an innermost ring which surrounds and centers the device region (9) and is grounded when the device region (9) works; the other P+ type diffusion rings (5) are concentric with the innermost ring and are floated when the device region (9) works;
   an equipotential ring (4) embedded in the second N type monocrystalline silicon substrate (8) and surrounding the periphery of the multiple P+ type diffusion rings (5);
   at least one N type diffusion ring (6) fully depleted at zero bias voltage, each N type diffusion ring (6) is embedded in one of the P+ diffusion rings (5) and surrounds and centers the device region (9).

2. The guarding ring structure according to claim 1, wherein the depth of the second N type monocrystalline silicon substrate (8) is greater than the junction depth of the P+ type diffusion ring (5) and less than 10 μm.

3. The guarding ring structure according to claim 1, wherein the N type diffusion ring (6) is close to the inner boundary of the P+ type diffusion ring (5) embedding the same.

4. The guarding ring structure according to claim 3, wherein the N type diffusion ring (6) is formed between the inner boundary of the P+ type diffusion ring (5) and the boundary of the depletion region of the P+ type diffusion ring (5).

5. The guarding ring structure according to claim 4, wherein the bottom boundary of the N type diffusion rings (6) is as deep as or shallower than that of the depletion region of the P+ type diffusion rings (5).

6. The guarding ring structure according to claim 1, wherein the doping concentration of the N type diffusion ring (6) is higher than that of the second N type monocrystalline silicon substrate (8) and is equal to or less than $1e15/cm^3$.

7. The guarding ring structure according to claim 1, wherein the thickness of the discontinuous oxide layers is 50 nm.

* * * * *